(12) United States Patent
Reinheimer

(10) Patent No.: US 11,493,077 B2
(45) Date of Patent: Nov. 8, 2022

(54) CONNECTING DEVICE TO ANTENNA HOUSINGS

(71) Applicant: REEL Reinheimer Elektronik GmbH, Huettenberg (DE)

(72) Inventor: Hans-Joerg Reinheimer, Wettenberg (DE)

(73) Assignee: REEL Reinheimer Elektronik GmbH, Huettenberg (DE)

( * ) Notice: Subject to any disclaimer, the term of this patent is extended or adjusted under 35 U.S.C. 154(b) by 1150 days.

(21) Appl. No.: 16/036,443

(22) Filed: Jul. 16, 2018

(65) Prior Publication Data
US 2019/0017531 A1   Jan. 17, 2019

(30) Foreign Application Priority Data
Jul. 17, 2017   (DE) .................... 10 2017 116 077.9

(51) Int. Cl.
| | |
|---|---|
| *F16B 39/10* | (2006.01) |
| *H01Q 1/42* | (2006.01) |
| *H01Q 1/12* | (2006.01) |
| *H01Q 1/32* | (2006.01) |
| *H05K 5/02* | (2006.01) |

(52) U.S. Cl.
CPC ............... *F16B 39/10* (2013.01); *H01Q 1/12* (2013.01); *H01Q 1/1214* (2013.01); *H01Q 1/3275* (2013.01); *H01Q 1/42* (2013.01); *H05K 5/0221* (2013.01)

(58) Field of Classification Search
CPC ........ F16B 39/10; H01Q 1/12; H01Q 1/1214; H01Q 1/3275; H01Q 1/42; H05K 5/0221
USPC ....... 455/11.1, 575.1, 575.5, 575.7; 296/210; 434/243
See application file for complete search history.

(56) References Cited

U.S. PATENT DOCUMENTS

| | | | | |
|---|---|---|---|---|
| 3,906,643 | A * | 9/1975 | McClung | G09B 9/26 434/243 |
| 4,566,664 | A * | 1/1986 | Donald | F16M 11/08 248/349.1 |
| 8,215,604 | B1 * | 7/2012 | Keicher | H01Q 1/12 343/882 |
| 2006/0032128 | A1 * | 2/2006 | Bryan, III | A01G 9/022 47/62 R |
| 2007/0232228 | A1 * | 10/2007 | McKay | H04B 7/1555 455/11.1 |
| 2013/0029526 | A1 * | 1/2013 | Berger | H01R 24/52 439/607.41 |
| 2013/0140847 | A1 * | 6/2013 | Altes | H01Q 1/1214 296/210 |
| 2019/0246776 | A1 * | 8/2019 | Tran | F16M 13/04 |

FOREIGN PATENT DOCUMENTS

DE    20 2016 107 520 U1    3/2017

* cited by examiner

*Primary Examiner* — Tan H Trinh
(74) *Attorney, Agent, or Firm* — Crowell & Moring LLP

(57) ABSTRACT

A connection device on an antenna housings includes a circular mounting platform, a covering cap, and a screw bolt. The circular mounting platform is configured to receive an antenna board on the top side. The bottom side of the mounting platform is provided with reinforcement ribs running radially toward the center. The covering cap is configured to completely cover the mounting platform. The screw-bolt is situated at the center of the mounting platform, and is configured to be inserted into an antenna housing carrier. The connection device is a rotary/latching connection.

11 Claims, 3 Drawing Sheets

CONNECTING DEVICE TO ANTENNA HOUSINGS

The invention relates to a connection device on antenna housings with the features of the preamble of Claim 1.

Antenna housings of this kind are known. The covering cap is usually connected by a non-removable snap connection to the mounting platform. If a testing of the functionality of the enclosed antenna board with antenna radiator or radiators should reveal that a readjustment is needed on account of the dielectric formed by the covering cap, the covering cap must be forcefully removed, which generally destroys it.

From utility model DE 20 2016 107 520 U1 there is known an antenna housing which consists of a plastic that is weldable by ultrasound and that is free of dipoles, and which is fastened on an antenna housing carrier by means of a screw bolt, provided with a hollow shaft and inserted in a torque-proof manner in the mounting platform. Here as well, the functionality must be carried out with covering cap welded in place, since the housing cannot be removed once more without destruction.

The torque-proof arrangement of a screw bolt in the mounting platform for the fastening of the antenna housing to a carrier requires both an additional manual torque securing on the antenna housing and the manual screwing on of a fastening nut on the screw bolt. Especially when attaching the antenna housing to a car roof, this generally requires helpers both inside and outside the motor vehicle.

Therefore, the problem which the invention proposes to solve is to create a connection device on antenna housings which on the one hand produces a secure connection between covering cap and mounting platform for the function testing, which however can be secured removably when needed and nondestructively for the function testing and after the function testing is completed it can be secured nonremovably for protection against vandalism. The fastening of the antenna housing on the carrier should in any case be possible by a single installer regardless of the installed location, and also during retrofitting or replacement of damaged antenna housing.

This problem is solved according to the invention by the features of Claim 1. Advantageous embodiments will appear from the features of the dependent claims.

Figure 2:
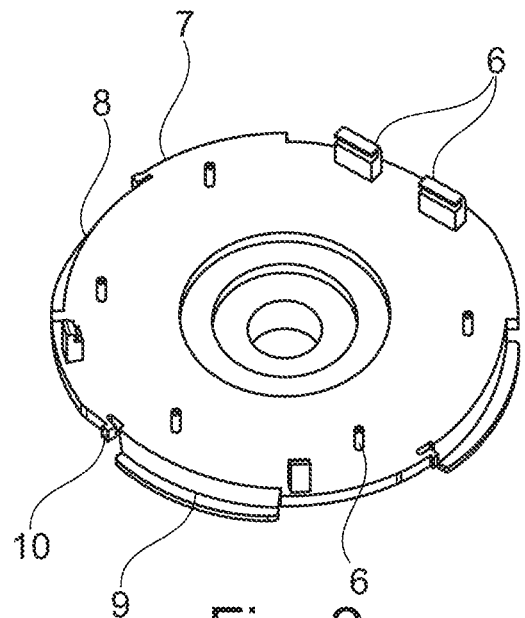
Figure 3:
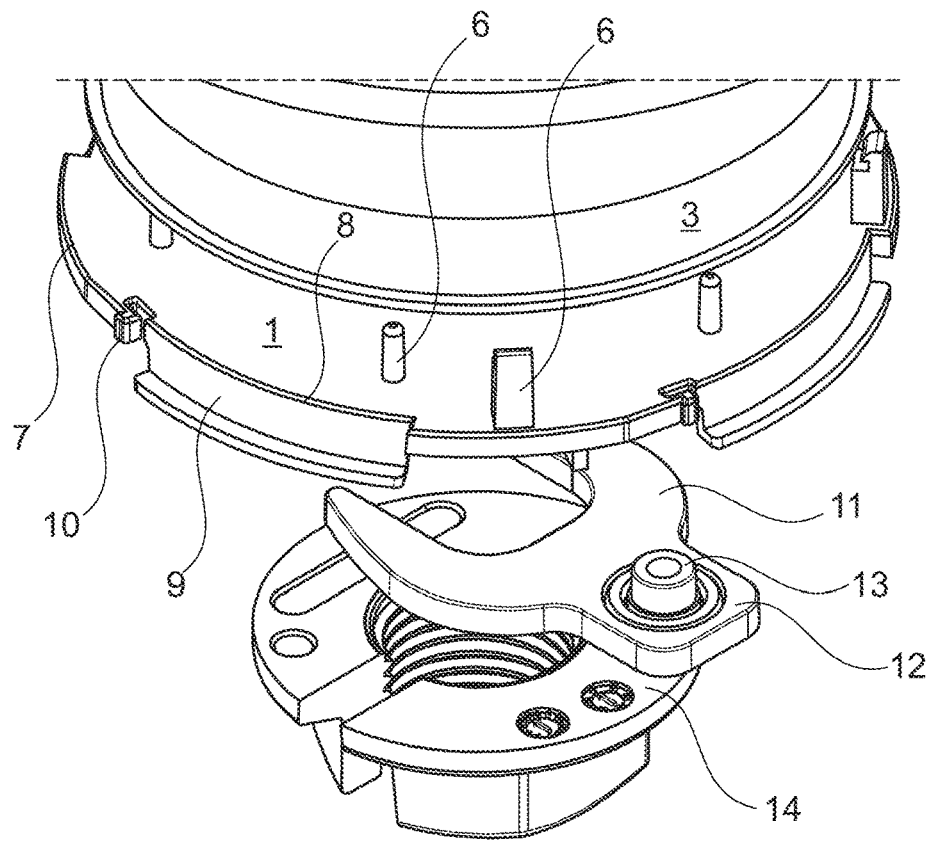
Figure 4:
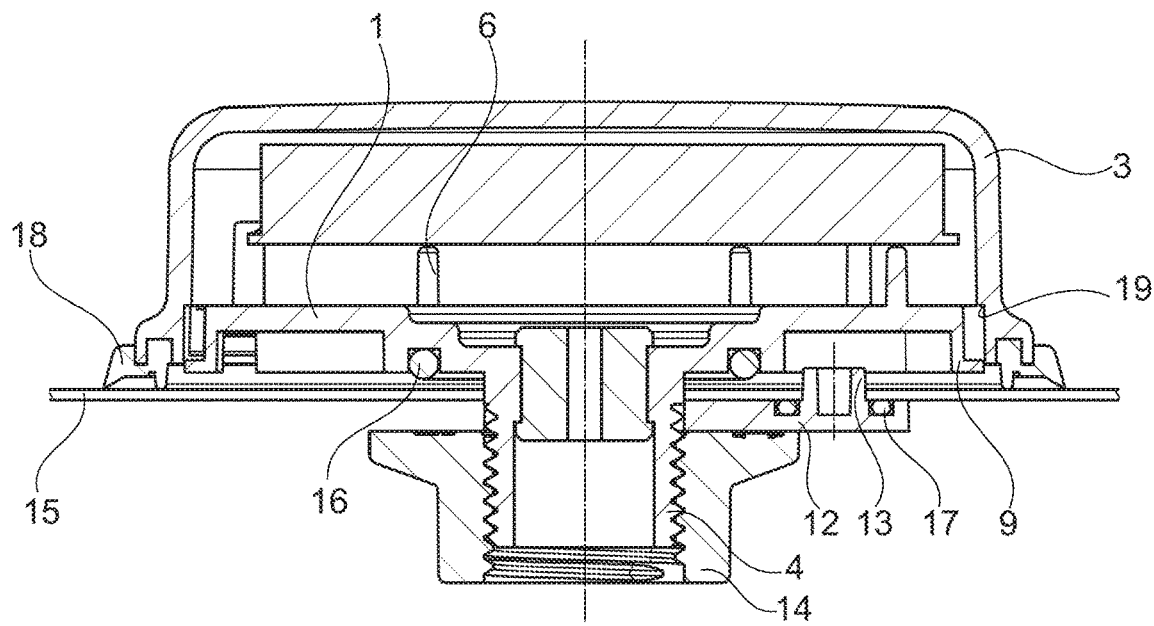
Figure 5C:
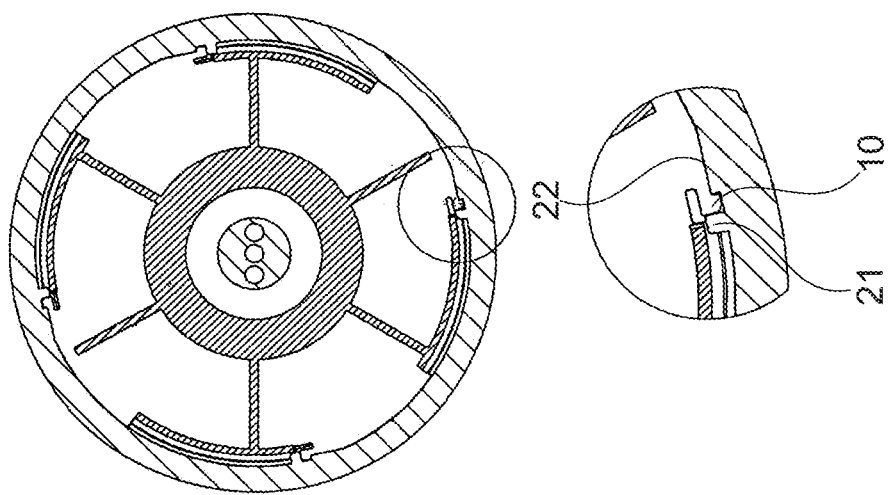
Figure 5B:
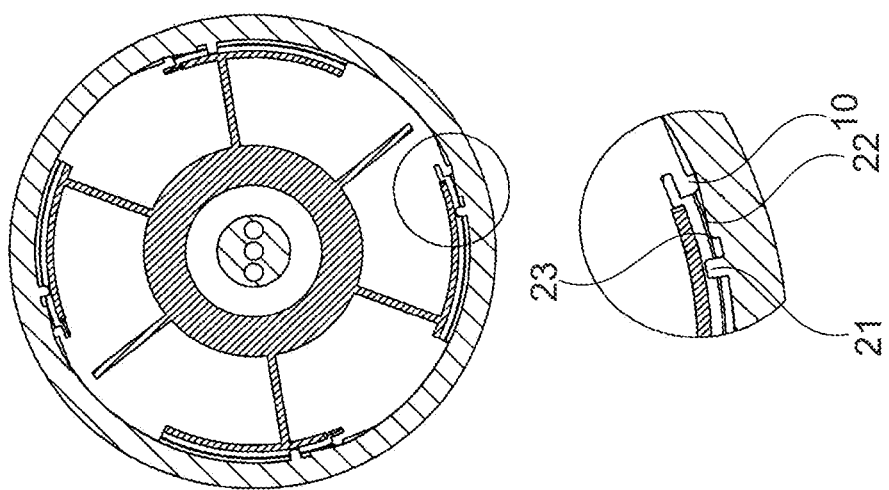
Figure 5A:
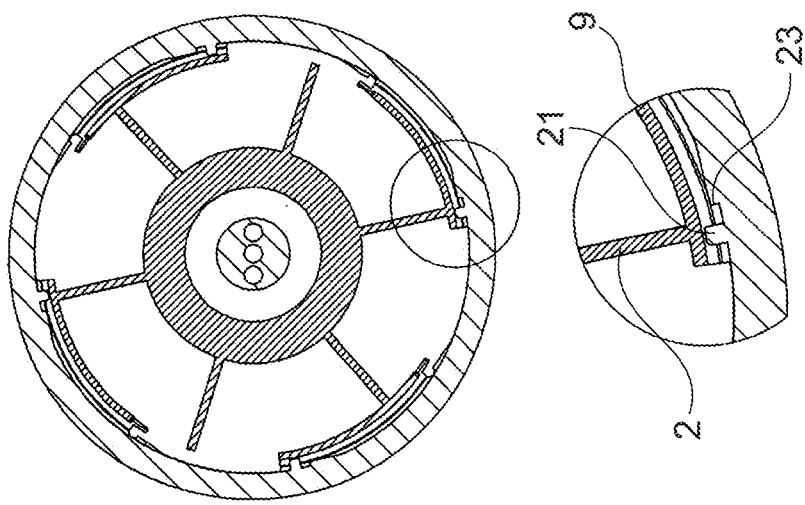

The drawing represents schematically a sample embodiment of the connection device according to the invention, which shall be described more closely below with the aid of the figures. In the figures FIG. 1 shows a perspective view of the antenna housing carrier from below, FIG. 2 shows a perspective view of the top side of the mounting platform, FIG. 3 shows a perspective view of the means of connection to the antenna housing carrier, FIG. 4 shows a cross-sectional representation of the antenna housing on an antenna housing carrier and FIG. 5a-c show the locking connection between mounting platform and covering cap.

The major feature of the subject matter of the invention is the rotary/latching connection both for the covering cap on the mounting platform and for the installing of the antenna housing in a carrier. When replacing older units for a new antenna housing with torque securing, it is only necessary to provide a further borehole in the antenna housing at a given distance next to the borehole for the placement of the fastening bolt.

Figure 1:
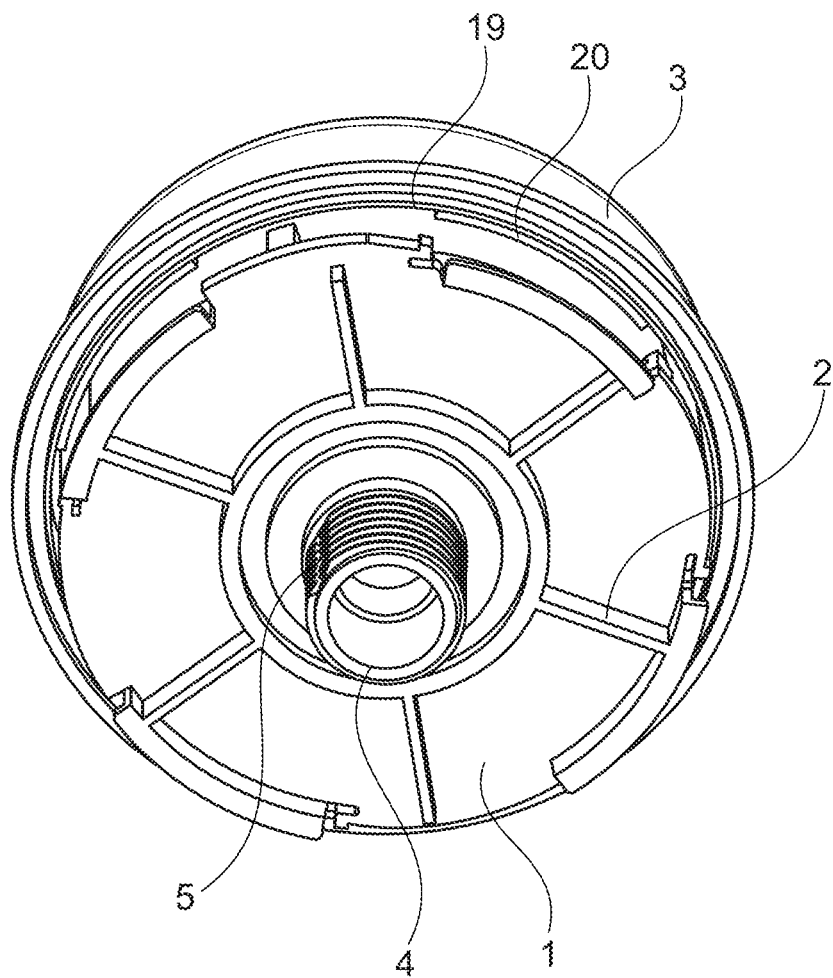

The perspective view from the bottom of the antenna housing shown in FIG. 1 shows a mounting platform 1 with radially arranged reinforcement ribs 2 and a covering cap 3 for the complete covering of the mounting platform 1. At the center of the mounting platform 1 there is arranged a screw bolt 4. The mounting platform 1 and the covering cap 3 after being placed one in the other can be twisted relative to each other. The covering cap 3 contains at the lower rim an encircling groove for installing a lip seal 18, shown in FIG. 4.

The screw bolt 4 is formed on the bottom side of the mounting platform 1 as a hollow bolt, standing firmly perpendicular, and it has two flats 5 situated parallel to each other. The plane of symmetry of the flats 5 points toward a region on the bottom side of the mounting platform 1 which is free of reinforcement ribs 2.

The view of the top side of the mounting platform 1 shown in FIG. 2 shows bearing and attachment supports 6 for an antenna board, not shown here. The mounting platform 1 is circular in shape and provided with various segments 7, 8 on its outer rim, having a different radius.

The segments 7 have a larger radius, which is adapted to insertion in the covering cap 3. The segments 8, as cutouts, have a smaller radius than this. On these segments 8 is respectively formed a downward pointing angle segment 9. The segments 7 have respective latching elements 10 at one end, which are formed as a resilient tongue by virtue of a slot-like undercutting. In front of the latching element 10 there is provided the rim segment 7 with an inward pointing portion, so that the head of the latching element 10 lies on the same circular arc as the rim segment 7.

FIG. 3 shows the fork tool 11 situated underneath the mounting platform 1 for grasping the flats 5 on the screw bolt 4, not shown here. The fork tool 11 is provided with a flat grip arm 12, on which a perpendicularly extending cylinder bolt 13 is arranged. The axis of the cylinder bolt 13 has a predetermined distance from the axis of the screw bolt 4. The fork tool 11 is tightened with a nut 14 on the screw bolt 4, not shown here, in the direction of the bottom side of the mounting platform 1, wherein the cylinder bolt 13 can engage in a borehole in the antenna housing carrier 15, so that a twisting of the antenna housing is effectively prevented.

FIG. 4 shows in a cross-sectional illustration the overall arrangement of the antenna housing on a sheet metal plate 15 as the carrier, which may be for example a car roof. In the bottom side of the mounting platform 1 there is inserted an O-ring 16, embracing the screw bolt 4, which seals off the mounting platform 1 against the sheet metal plate 15. A corresponding smaller O-ring 17 is arranged around the cylinder bolt 13, sealing off the engagement of the cylinder bolt 13 in the sheet metal plate 15. The covering cap 3 is sealed off by a known lip seal 18 against the sheet metal plate 15.

The cross section shown in FIG. 4 through the antenna housing cuts the mounting platform 1 in regions of the rim segment 8 with the angle segment 9 formed on it. The rim segment 7 lies on top of an encircling bearing surface 19 on the inside of the covering cap 3. For this, refer to the view in FIG. 1, which also shows the guide strip 20 spaced apart from the bearing surface 19.

After installing the mounting platform 1 in the segment region between two consecutive guide strips 20, the mounting platform 1 and the covering cap 3 can be twisted relative to each other. At first, the angle segment 9 at the rim segment 8 lies on a guide strip 20 almost flush with the rim of the covering cap 3. Upon twisting, the rim segment 7 is pushed beneath the guide strip 20 and the angle segment 9 accordingly covers the insertion region of the rim segment 7.

Between guide strip 20 and bearing surface 19 is introduced an abutment web 21 which limits the twisting, as can be seen in FIG. 5a for example. In the turning direction before the abutment web 21, the bearing surface 19 at the covering cap 3 is provided with a leading ramp 22 reinforcing the wall thickness of the covering cap 3 with a step edge 23 situated in front of the abutment web 21.

When the covering cap 3 is twisted relative to the mounting platform 1, the latching element 10 runs onto the leading ramp 22 and a perceptible resistance is felt. The covering cap 3 can be connected firmly to the mounting platform 1 for testing purposes and loosened again when needed by backward turning. After the function test is over, the latching element 10 after overcoming the turning resistance can move across the step edge 23 and pop into the gap between abutment web 21 and step edge 23, permanently securing the connection between covering cap 3 and mounting platform 1.

FIG. 5 shows the process of inserting the two parts into each other (FIG. 5a) and locking them (FIG. 5c). The latching element 10 here is designed with a resilient tongue by the slot-like undercutting, so that the latching element 10 can slip into the surface of the mounting platform 1 upon running onto the leading ramp 22. But the latching element 10 may also be designed without this slot-like undercutting. But then the wall of the covering cap 3 needs to be pressed outward in order to overcome the resistance to turning.

LIST OF REFERENCE NUMBERS

1 Mounting platform
2 Reinforcement ribs
3 Covering cap
4 Screw bolt
5 Flats
6 Bearing/fastening supports
7 Rim segment of large radius
8 Rim segment of smaller radius
9 Angle segment
10 Latching element
11 Fork tool
12 Grip arm
13 Cylinder bolt
14 Nut
15 Sheet metal plate/antenna housing carrier
16 O-ring
17 Smaller O-ring
18 Lip seal
19 Bearing surface in covering cap
20 Guide strip in covering cap
21 Abutment web
22 Leading ramp
23 Step edge

The invention claimed is:

1. A connection device on an antenna housings comprising:
   a circular mounting platform configured to receive an antenna board on the top side, wherein the bottom side of the mounting platform is provided with reinforcement ribs running radially toward the center;
   a covering cap configured to completely cover the mounting platform; and
   a screw-bolt situated at the center of the mounting platform, and being configured to be inserted into an antenna housing carrier, wherein the connection device formed between the covering cap and mounting platform is a rotary/latching connection having:
   i) a rotary position, which is locked but releasable in a nondestructive manner, and
   ii) a latching position, which is locked and not releasable by further rotation.

2. The connection device according to claim 1, wherein the screw-bolt is formed as a hollow bolt on the bottom side of the mounting platform, standing perpendicular to it, and
the screw thread has two flats situated parallel to each other.

3. The connection device according to claim 2, wherein the plane of symmetry of the flats points toward a region on the bottom side of the mounting platform which is free of reinforcement ribs.

4. The connection device according to claim 2, wherein a fork tool grasping the flats is provided with a flat grip arm, in whose surface is arranged a cylinder bolt engaging in a bore in the antenna housing carrier after a corresponding rotation of the mounting platform.

5. The connection device according to claim 4, wherein the screw-bolt is surrounded by an O-ring arranged in the bottom side of the mounting platform configured to seal it off against the antenna housing carrier, and
the cylinder bolt arranged on the grip arm of the fork tool is surrounded by a smaller O-ring arranged in the grip arm configured to seal it off against the antenna housing carrier.

6. The connection device according to claim 5, wherein an encircling bearing surface is arranged on the inside of the covering cap at a distance from the cap rim,
between the bearing surface and cap rim are arranged segment-shaped guide strips of almost the same width as the bearing surface for the rotatable insertion of the mounting platform,
the distance between the bearing surface and the guide strips is adapted to the thickness of the surface of the mounting platform, and
segment-shaped cutouts adapted to the guide strip in length and width are introduced into the circumferential rim of the mounting platform for the placement of the mounting platform on the bearing surface.

7. The connection device according to claim 5, wherein an abutment web bounding the rotation is introduced in the rotary direction between the guide strip and the bearing surface.

8. The connection device according to claim 5, wherein angle segments are formed on the cutouts, perpendicular to the surface of the mounting platform, which overlap the guide strips upon rotation between covering cap and mounting platform, and
the angle segments are adapted in their thickness in the overlap region to the distance between the guide strips and the cap rim.

9. The connection device according to claim 8, wherein an inwardly pointing leading ramp is introduced into the wall of the covering cap before the abutment web in the rotary direction, with a step edge spaced away from the abutment web, and
a radially outward pointing latching element, which is displaceable across the step edge, is formed on the segments of the mounting platform engaging between guide strip and bearing surface on the front segment region pointing toward the abutment web in the rotary direction.

10. The connection device according to claim 8, wherein the size of the latching element is adapted to the distance of the step edge from the abutment web.

11. The connection device according to claim 8, wherein the latching element has a resilient tongue having a spring path in the plane of the mounting platform.

* * * * *